US009569304B2

United States Patent
Girouard et al.

(10) Patent No.: US 9,569,304 B2
(45) Date of Patent: *Feb. 14, 2017

(54) PREPROCESSING KERNEL PRINT COMMANDS (71) Applicant: INTERNATIONAL BUSINESS MACHINES CORPORATION, Armonk, NY (US)

(72) Inventors: Janice M. Girouard, Austin, TX (US); Yehuda Shiran, Haifa (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/818,999

(22) Filed: Aug. 5, 2015

(65) Prior Publication Data
US 2015/0339185 A1 Nov. 26, 2015

Related U.S. Application Data (63) Continuation of application No. 14/010,737, filed on Aug. 27, 2013, now Pat. No. 9,158,513.

(51) Int. Cl.
G06F 9/45 (2006.01)
G06F 11/10 (2006.01)
(Continued)

(52) U.S. Cl.
CPC ......... *G06F 11/1004* (2013.01); *G06F 3/1273* (2013.01); *G06F 8/41* (2013.01);
(Continued)

(58) Field of Classification Search
CPC ............... G06F 8/41; G06F 8/61; G06F 8/40; G06F 8/43; G06F 8/423; G06F 11/6304
See application file for complete search history.

(56) References Cited

U.S. PATENT DOCUMENTS 5,121,475 A 6/1992 Child et al.
7,921,234 B2 4/2011 Condorelli et al.
(Continued)

FOREIGN PATENT DOCUMENTS

JP 2012173985 A 9/2012

OTHER PUBLICATIONS

Xiaobing Sun et al., Empirical studies on the NLP techniques for source code data preprocessing, 2014, retrieved online on Sep. 11, 2016, pp. 32-39. Retrieved from the Internet: <URL: http://delivery.acm.org/10.1145/2630000/2627514/p32-sun.pdf?>.*
(Continued)

*Primary Examiner* — Thuy Dao
*Assistant Examiner* — Hanh T Bui
(74) *Attorney, Agent, or Firm* — Griffiths & Seaton PLLC (57) ABSTRACT Methods, apparatus and computer program products implement embodiments of the present invention that include replacing, in one or more initial source code files, each reference to a first function configured to convey system messages with a respective reference to a second function configured to convey the system messages, thereby producing respective corresponding preprocessed source code files for the one or more initial source code files. The respective corresponding preprocessed source code files are then compiled, thereby creating an executable file. Based on an identified name and a text string, a computed destination is determined for the text string.

12 Claims, 4 Drawing Sheets (51) Int. Cl.
  *G06F 11/36* (2006.01)
  *H03M 13/09* (2006.01)
  *G06F 3/12* (2006.01)
  *G06F 9/44* (2006.01)

(52) U.S. Cl.
  CPC ............ *G06F 8/423* (2013.01); *G06F 9/4426* (2013.01); *G06F 11/3604* (2013.01); *H03M 13/096* (2013.01); *G06F 8/30* (2013.01); *G06F 8/43* (2013.01); *G06F 8/443* (2013.01)

(56) References Cited

U.S. PATENT DOCUMENTS

| | | | |
|---|---|---|---|
| 8,108,844 B2 | 1/2012 | Crutchfield et al. | |
| 8,458,680 B2* | 6/2013 | Crutchfield | G06F 8/443 717/140 |
| 8,620,874 B1 | 12/2013 | Xavier et al. | |
| 2003/0200532 A1* | 10/2003 | Gensel | G06F 8/71 717/120 |
| 2007/0261022 A1* | 11/2007 | Heuer | G06F 17/2229 717/106 |
| 2009/0313604 A1 | 12/2009 | Miceli | |
| 2011/0239190 A1* | 9/2011 | Mueller | G06F 8/65 717/121 |
| 2011/0295806 A1* | 12/2011 | Erofeev | G06F 11/1435 707/634 |
| 2012/0096446 A1 | 4/2012 | Miceli | |
| 2012/0110559 A1* | 5/2012 | Dolinsky | G06F 8/45 717/140 |
| 2013/0159982 A1 | 6/2013 | Lerios | |
| 2013/0232468 A1* | 9/2013 | Betouin | G06F 8/423 717/110 |
| 2014/0109067 A1 | 4/2014 | Flicker et al. | |
| 2014/0173269 A1* | 6/2014 | Varoglu | H04L 51/18 713/150 |

OTHER PUBLICATIONS

Yoshisato Yanagisawa et al., "A Dynamic Aspect-oriented System for OS Kernels", 10 pages, Tokyo Institute of Technology, 2006.
Andrew Turpin et al., "Efficient Approximate Adaptive Coding" 10 pages, IEEE, 1997.
Limagito FileMover, Move your files from anywhere to anywhere, www.limagito.com, May 2011(72 pages).
Limagito, Automating the Moving of Files www.limagito.com, Feb. 2011.
Jensen, B. et al., Error Control Resource Compilation Table, Mar. 2005.

\* cited by examiner

| CHECKSUM | FILE NAME | MESSAGE TEXT | LOG FILE | MEMORY BUFFER | CONSOLE | EVENT MONITOR |
|---|---|---|---|---|---|---|
| 3683585642 | kernel_1.c | "%s -version %s\n" | NO | YES | NO | NO |
| 0694091528 | kernel_1.c | "%s Enabled\n" | YES | YES | NO | NO |
| 3006718959 | kernel_1.c | "%s Is Disabled\n" | YES | NO | YES | YES |
| 2174240856 | kernel_2.c | "%s Is Disabled\n" | YES | NO | YES | NO |
| 90 | 92 | 94 | 96 | 98 | 100 | 102 |

PREPROCESSING KERNEL PRINT COMMANDS

CROSS-REFERENCE TO RELATED APPLICATIONS

This application is a Continuation of U.S. patent application Ser. No. 14/010,737, filed Aug. 27, 2013, which is related to U.S. patent application titled "Selecting Output Destinations for Kernel Messages", filed on even date with the present application, and which is incorporated herein by reference.

FIELD OF THE INVENTION

The present invention relates generally to operating system kernels, and specifically to a method of controlling the output destination for individual error/log messages based on a downloadable configuration file.

BACKGROUND

Operating systems are computer programs which manage the way software applications utilize the hardware of computer systems. A fundamental component of operating systems is the operating system kernel (also referred to herein as a "kernel"), which provides secure computer system hardware access to software applications executing on the computer system. Since accessing the hardware can be complex, kernels may implement a set of hardware abstractions to provide a clean and uniform interface to the underlying hardware. The abstractions provided by the kernel provide software developers easier access to the hardware when writing software applications.

The description above is presented as a general overview of related art in this field and should not be construed as an admission that any of the information it contains constitutes prior art against the present patent application.

SUMMARY

There is provided, in accordance with an embodiment of the present invention a method, including replacing, in one or more initial source code files, each reference to a first function configured to convey operating system kernel log messages with a respective reference to a second function configured to convey the operating system kernel log messages, thereby producing respective corresponding preprocessed source code files for the one or more initial source code files; compiling the respective corresponding preprocessed source code files, thereby creating an operating system kernel; prior to executing the operating system kernel: identifying, in a given respective corresponding preprocessed source code file, a given reference to the second function call having a respective message text, the given respective corresponding preprocessed source code file having a given file name, calculating, using the given file name and the respective message text, a configuration checksum, assigning a respective destination to the configuration checksum, adding a record to a configuration file stored on a storage device coupled to the processor, storing, to the added record, the respective destination and a key comprising the configuration checksum, and loading the record to an entry in a configuration table stored in a memory coupled to the processor; and while executing the operating system kernel: determining, based on an identified name and a text string, a computed destination for the text string, including calculating, using the identified name and the text string, a message checksum, and identifying, in the configuration table, an entry having a key equal to the message checksum, and wherein the determined destination comprises the respective destination in the identified entry.

In addition to the foregoing exemplary embodiment, various other system and computer program product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

The disclosure is herein described, by way of example only, with reference to the accompanying drawings, wherein.

DETAILED DESCRIPTION OF EMBODIMENTS

In a computer system executing a Linux™ operating system kernel, system information can be logged using the PRINTK function. When calling the PRINTK function, a log message (also referred to herein as message text) and a priority parameter indicating a "log level" can be included in the function call, and the PRINTK function can use the priority parameter to determine an output destination (e.g., a console, a memory buffer or a disk file) for the log message. Each of the output destinations has its own advantages and disadvantages, and the output destination for a particular log level can be set by a programmer when the kernel is compiled.

Since the Linux™ operating system is open source, a hardware vendor may customize the kernel in order to optimize performance on the vendor's hardware. Additionally, the vendor may add a customized kernel print function that additional functionality than the PRINTK function. For example, Vendor "X" may add a custom function to the kernel call XPRINTK. Therefore, a Linux™ kernel customized by vendor X may include PRINTK and XPRINTK function calls, wherein both of the function calls are configured to request operating system kernel log messages.

Embodiments of the present invention provide methods and mechanisms for a computer executing a Linux™ operating system kernel to dynamically select an output destination for a given system message. In some embodiments, a default kernel print function can be defined, and a preprocessor can be configured to replace, in the kernel source code, all references to one or more first functions with a respective reference to the default function (also referred to herein as a second kernel print function). For example, the preprocessor can be configured to replace all references to PRINTK and XPRINTK (i.e., the one or more first functions) with respective references to DPRINTK (i.e., a default kernel print function, also referred to herein as the second function). The preprocessed kernel source code can be compiled to generate a revised kernel, and the revised kernel can be booted (i.e., executed).

Additionally, a configuration file can be created that contains one or more records, wherein each record has a key comprising a checksum value (also referred to herein as a configuration checksum) indicating a given call to the default function, and a respective destination for a message generated by the given call. As described hereinbelow, the checksum value can be calculated based on a name of a source code file containing the given call to the default function and message text included as a parameter in the given call.

In operation (i.e., while the revised kernel is executing), upon being called, the default function can identify a name of given source code file containing the function call, calculate an additional checksum (also referred to herein as a message checksum) based on the identified name and message text received in the function call, and upon identifying an entry in the configuration table having a key matching the message checksum, convey the message text to a respective destination retrieved from the identified entry.

Figure 1:
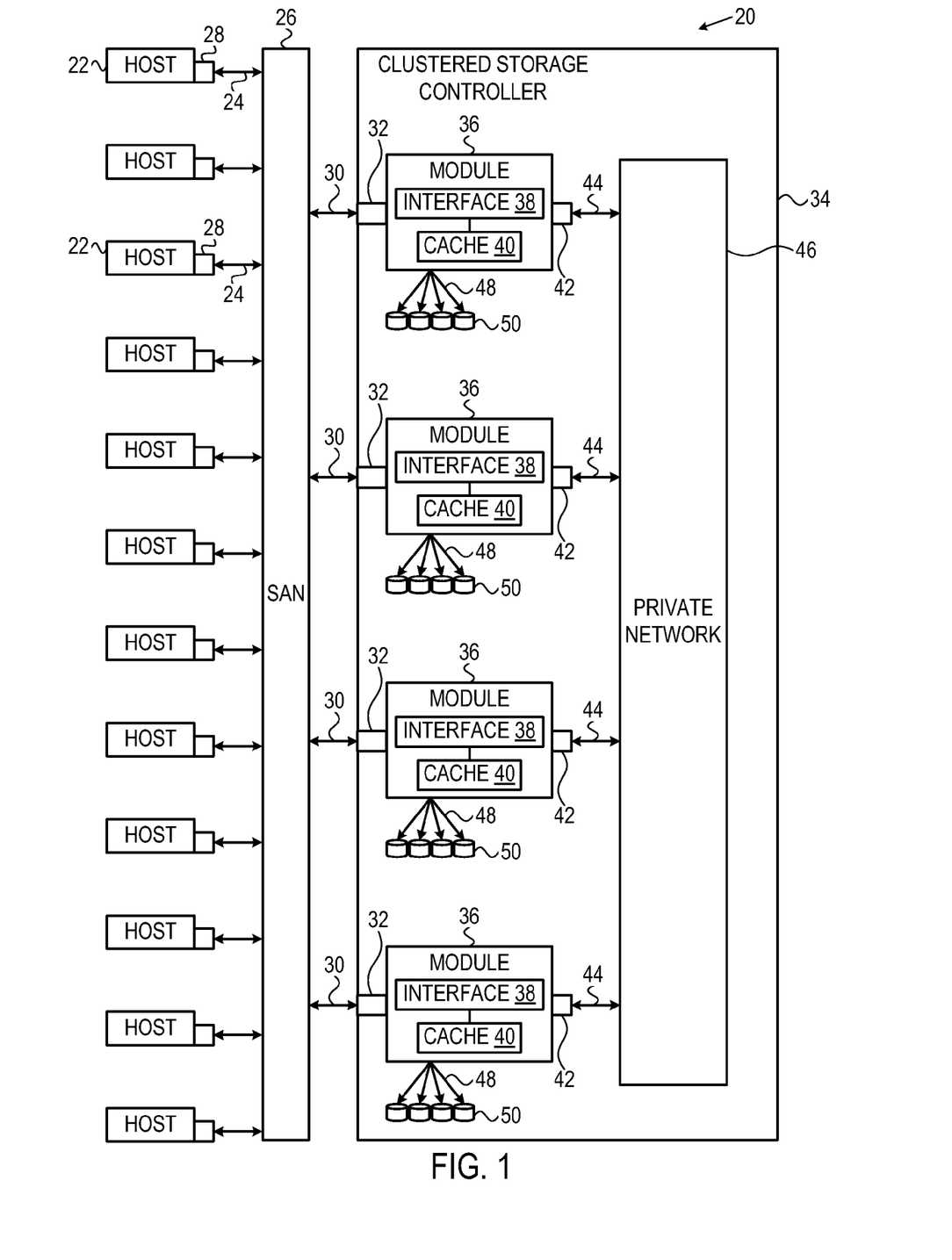
FIG. 1 is a block diagram that schematically illustrates a storage system, in accordance with an embodiment of the present invention.

FIG. 1 is a block diagram that schematically illustrates a data processing storage subsystem 20, in accordance with an embodiment of the invention. The particular subsystem (also referred to herein as a storage system) shown in FIG. 1 is presented to facilitate an explanation of the invention. However, as the skilled artisan will appreciate, the invention can be practiced using other computing environments, such as other storage subsystems with diverse architectures and capabilities.

Storage subsystem 20 receives, from one or more host computers 22, input/output (I/O) requests, which are commands to read or write data at logical addresses on logical volumes. Any number of host computers 22 are coupled to storage subsystem 20 by any means known in the art, for example, using a network. Herein, by way of example, host computers 22 and storage subsystem 20 are assumed to be coupled by a Storage Area Network (SAN) 26 incorporating data connections 24 and Host Bus Adapters (HBAs) 28. The logical addresses specify a range of data blocks within a logical volume, each block herein being assumed by way of example to contain 512 bytes. For example, a 10 KB data record used in a data processing application on a given host computer 22 would require 20 blocks, which the given host computer might specify as being stored at a logical address comprising blocks 1,000 through 1,019 of a logical volume. Storage subsystem 20 may operate in, or as, a SAN system.

Storage subsystem 20 comprises a clustered storage controller 34 coupled between SAN 26 and a private network 46 using data connections 30 and 44, respectively, and incorporating adapters 32 and 42, again respectively. In some configurations, adapters 32 and 42 may comprise host bus adapters (HBAs). Clustered storage controller 34 implements clusters of storage modules 36, each of which includes an interface 38 (in communication between adapters 32 and 42), and a cache 40. Each storage module 36 is responsible for a number of storage devices 50 by way of a data connection 48 as shown.

As described previously, each storage module 36 further comprises a given cache 40. However, it will be appreciated that the number of caches 40 used in storage subsystem 20 and in conjunction with clustered storage controller 34 may be any convenient number. While all caches 40 in storage subsystem 20 may operate in substantially the same manner and comprise substantially similar elements, this is not a requirement. Each of the caches 40 may be approximately equal in size and is assumed to be coupled, by way of example, in a one-to-one correspondence with a set of physical storage devices 50, which may comprise disks. In one embodiment, physical storage devices may comprise such disks. Those skilled in the art will be able to adapt the description herein to caches of different sizes.

Each set of storage devices 50 comprises multiple slow and/or fast access time mass storage devices, herein below assumed to be multiple hard disks. FIG. 1 shows caches 40 coupled to respective sets of storage devices 50. In some configurations, the sets of storage devices 50 comprise one or more hard disks, which can have different performance characteristics. In response to an I/O command, a given cache 40, by way of example, may read or write data at addressable physical locations of a given storage device 50. In the embodiment shown in FIG. 1, caches 40 are able to exercise certain control functions over storage devices 50. These control functions may alternatively be realized by hardware devices such as disk controllers (not shown), which are linked to caches 40.

Each storage module 36 is operative to monitor its state, including the states of associated caches 40, and to transmit configuration information to other components of storage subsystem 20 for example, configuration changes that result in blocking intervals, or limit the rate at which I/O requests for the sets of physical storage are accepted.

Routing of commands and data from HBAs 28 to clustered storage controller 34 and to each cache 40 may be performed over a network and/or a switch. Herein, by way of example, HBAs 28 may be coupled to storage modules 36 by at least one switch (not shown) of SAN 26, which can be of any known type having a digital cross-connect function. Additionally or alternatively, HBAs 28 may be coupled to storage modules 36.

In some embodiments, data having contiguous logical addresses can be distributed among modules 36, and within the storage devices in each of the modules. Alternatively, the data can be distributed using other algorithms, e.g., byte or block interleaving. In general, this increases bandwidth, for instance, by allowing a volume in a SAN or a file in network attached storage to be read from or written to more than one given storage device 50 at a time. However, this technique requires coordination among the various storage devices, and in practice may require complex provisions for any failure of the storage devices, and a strategy for dealing with error checking information, e.g., a technique for storing parity information relating to distributed data. Indeed, when logical unit partitions are distributed in sufficiently small granularity, data associated with a single logical unit may span all of the storage devices 50.

While such hardware is not explicitly shown for purposes of illustrative simplicity, clustered storage controller 34 may be adapted for implementation in conjunction with certain hardware, such as a rack mount system, a midplane, and/or a backplane. Indeed, private network 46 in one embodiment may be implemented using a backplane. Additional hardware such as the aforementioned switches, processors, controllers, memory devices, and the like may also be incorporated into clustered storage controller 34 and elsewhere within storage subsystem 20, again as the skilled artisan will appreciate. Further, a variety of software components, operating systems, firmware, and the like may be integrated into one storage subsystem 20.

Storage devices 50 may comprise a combination of high capacity hard disk drives and solid state disk drives. In some embodiments each of storage devices 50 may comprise a logical storage device. In storage systems implementing the Small Computer System Interface (SCSI) protocol, the logical storage devices may be referred to as logical units, or LUNs. While each LUN can be addressed as a single logical unit, the LUN may comprise a combination of high capacity hard disk drives and/or solid state disk drives.

Examples of adapters 32 and 42 include switched fabric adapters such as Fibre Channel (FC) adapters, Internet Small Computer System Interface (iSCSI) adapters, Fibre Channel over Ethernet (FCoE) adapters and Infiniband™ adapters.

Figure 2:
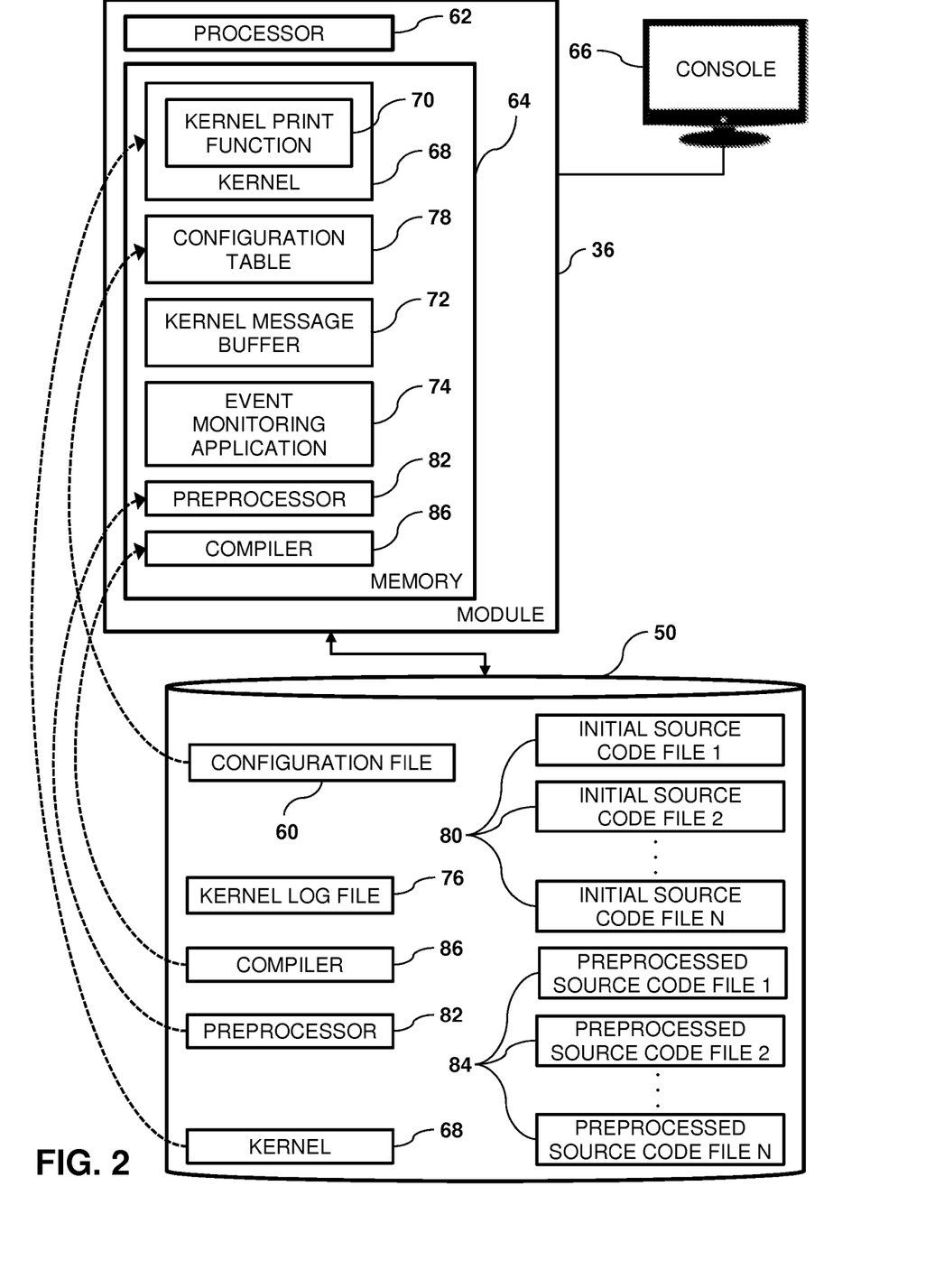
FIG. 2 is a block diagram of a module of the storage system arranged to use a configuration file to control the output destination of individual kernel log messages, in accordance with an embodiment of the present invention.

FIG. 2 is a block diagram of a given module 36 arranged to use a configuration file 60 to control the output destination of individual error messages and log messages, in accordance with an embodiment of the present invention. In embodiments herein, error messages and log messages may collectively be referred to as log messages. Module 36 comprises a processor 62 and a memory 64, and is coupled to a console 66 (e.g., an LCD display).

In operation, processor 62 loads an operating system kernel 68 from storage device 50 to memory 64, and executes the kernel from the memory. Kernel 68 comprises a kernel print function 70 that can be configured to convey a given log message to a given destination. In the configuration shown in FIG. 2, the destinations comprise console 66, a kernel message buffer 72 in memory 64, an event monitoring application 74 (e.g., a SNMP application) in memory 64 or a kernel log file 76 stored on storage device 50. In some embodiments, kernel print function 70 may be configured to convey a given log message to a "null" destination (i.e., a "no-op" command).

Examples of kernel log files 76 that can be stored on storage device 50 include, but are not limited to:
  A single system log file. An example of a single system log file comprises the /var/log/messages file in systems executing a Linux™ kernel. In some embodiments, the single system log file may be configured as a first in, first out (FIFO) system-wide debug log.
  Multiple system log files. For example, systems executing a Linux™ kernel may maintain a separate log file for each device driver executing on the system.

Storage device 50 also stores one or more initial source code files 80 that a preprocessor application 82 (loaded to memory 64 from storage device 50 and executed from memory 64) can read in order to generate one or more corresponding preprocessed source code files 84, as is known in the art. While processing a given initial source code file 60, preprocessor application 82 is configured to replace each reference to a first function configured to convey system messages with a respective reference to a second function also configured to convey system messages, thereby generating a corresponding preprocessed source code file 84 for the given initial source code file.

Processor 62 is also configured to load a compiler 86 from storage device 50 to memory 64, and execute the compiler from the memory. While executing compiler 86, processor 62 can read the one or more preprocessed source code files and generate an executable file (e.g., kernel application 68 on storage device 50).

In embodiments described herein, processor 62 can populate a configuration table 78 in memory 64 with data retrieved from configuration file 60 on storage device 50, and kernel print function 70 can use data stored in configuration table 78 to determine a given destination for a given log message. As described hereinbelow, upon being called, kernel print function 70 can determine a destination for a given log message by calculating, based on the given log message and a name of a given kernel source file 80 that stores the call to the kernel print function, a checksum, and then retrieve a destination from an entry in configuration table 78 having a key equal to the calculated checksum.

Figure 3:
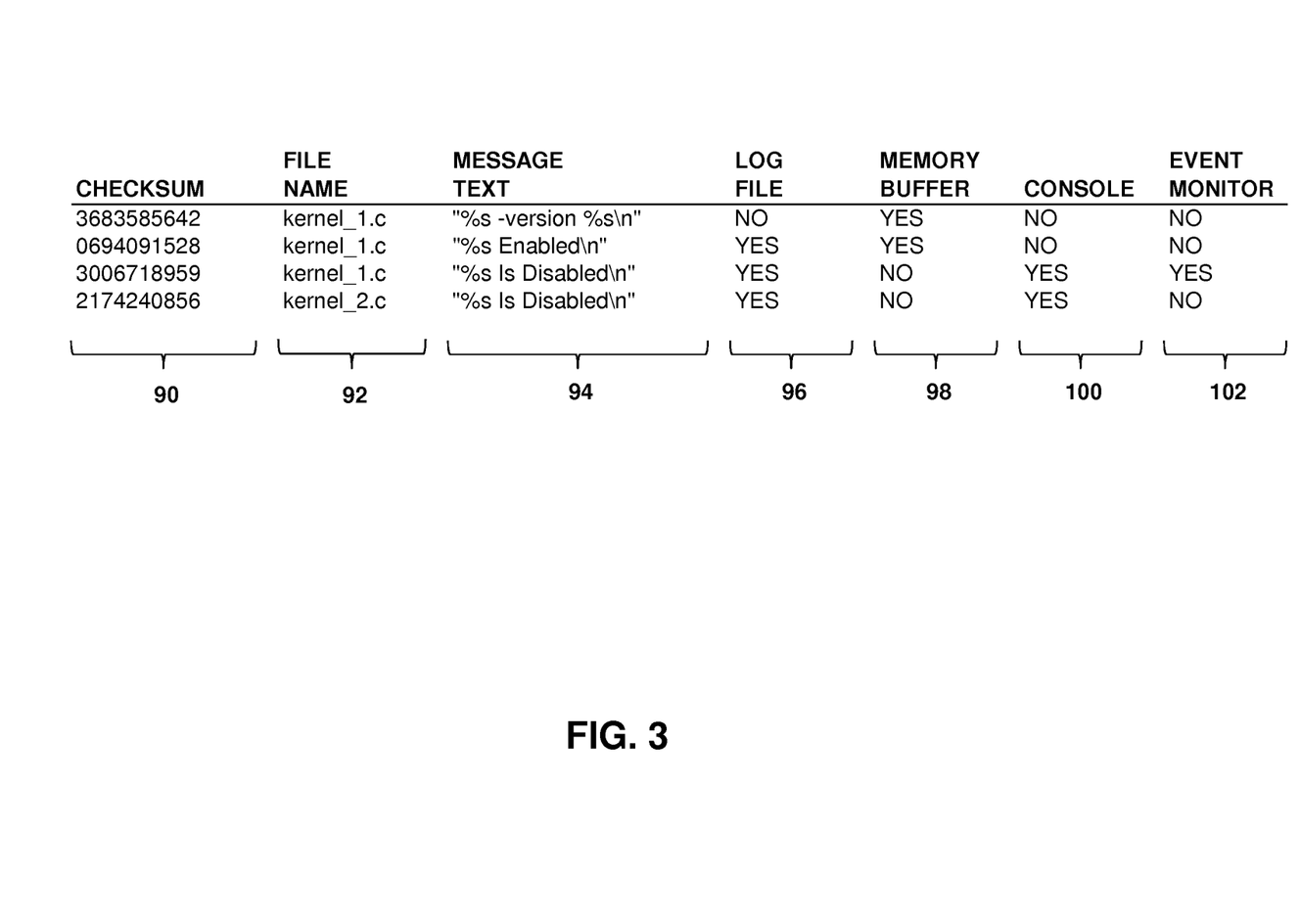
FIG. 3 is a table that shows sample entries in the configuration file, in accordance with an embodiment of the present invention.

FIG. 3 is a sample layout of configuration file 60, in accordance with an embodiment of the present invention. Each record in configuration file 60 references a given call to kernel print function 70 in kernel 68, and comprises a checksum 90, a source file identifier 92, message text 94 and destination flags 96, 98, 100 and 102. Destination flags 96-102 comprise "YES"/"NO" values that determine one or more given destinations for a given instance of kernel print function 70 referenced by a given checksum 90. For a given record in the configuration file having a given message text 94:
  If flag 96 is set (i.e., stores "YES"), then kernel print function 70 conveys the given message text to kernel log file 76.
  If flag 98 is set, then kernel print function 70 conveys the given message text to kernel message buffer 72.
  If flag 100 is set, then kernel print function 70 conveys the given message text to console 66.
  If flag 102 is set, then kernel print function 70 conveys the given message text to event monitoring application 74.

In the following example, default kernel print function 70 comprises a function called DPRINTK, and the first record in configuration file 60 comprises a given call to kernel print function 70 that conveys "% s-version % s\n" to kernel message buffer 72 and references the following source code statement in source code file 80 "kernel_1.c":

---
dprintk(KERN_INFO "%s- version %s\n", my_driver_string, ,my_driver_version);
---

In some embodiments, a given message text 94 may be conveyed to multiple destinations. For example, in the second record in configuration file 60, processor 62 configures kernel print function 70 to convey "% s Is Disabled\n" to kernel log file 76 and kernel message buffer 72, since flags 96 and 98 are both set.

Processor 62 typically comprises a general-purpose central processing unit (CPU), which is programmed in software to carry out the functions described herein. The software may be downloaded module 36 in electronic form, over a network, for example, or it may be provided on non-transitory tangible media, such as optical, magnetic or electronic memory media. Alternatively, some or all of the functions of processor 62 may be carried out by dedicated or programmable digital hardware components, or using a combination of hardware and software elements.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Log Message Generation

Figure 4:
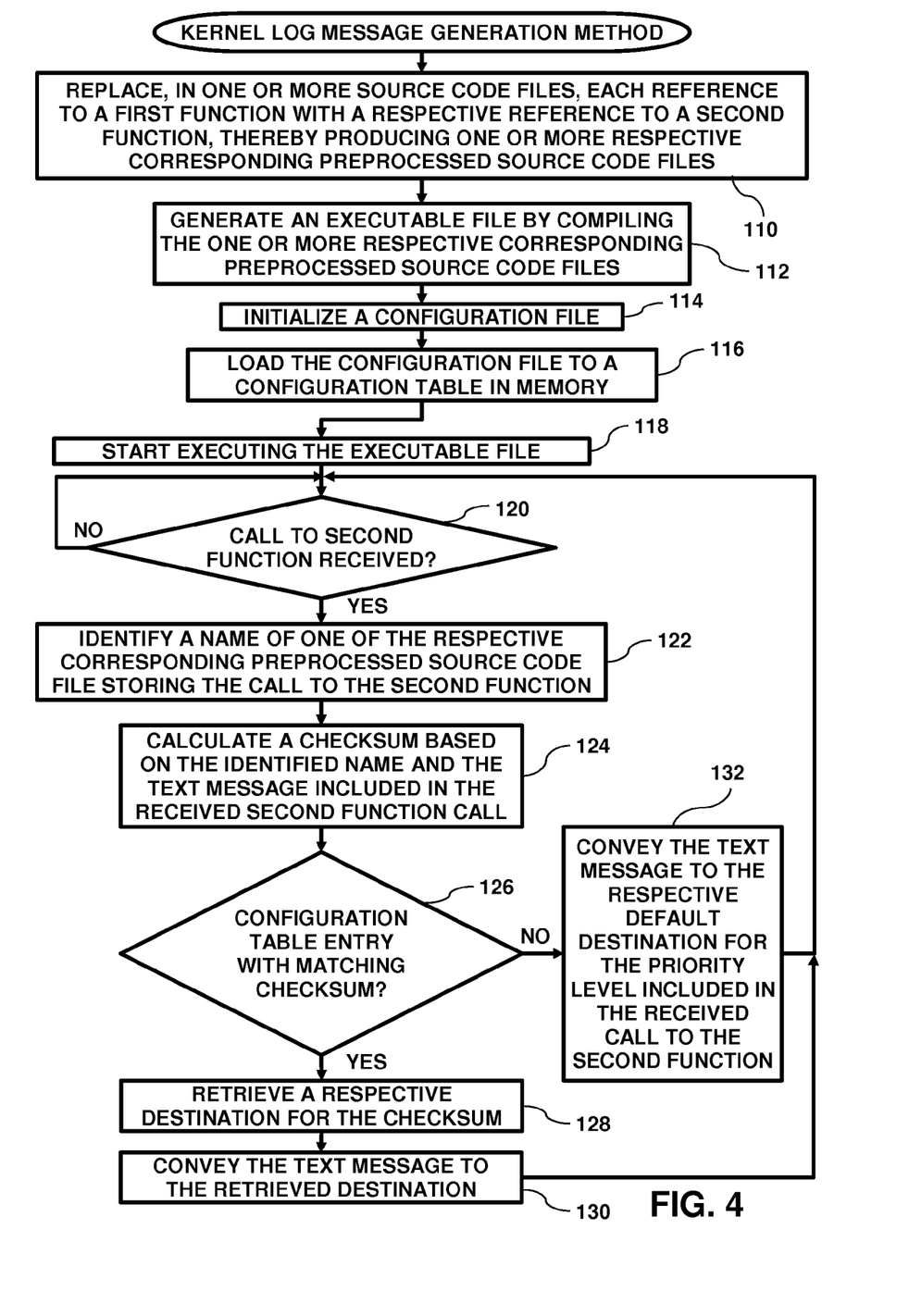
FIG. 4 is a flow diagram that schematically illustrates a method for generating kernel log messages, in accordance with an embodiment of the present invention.

FIG. 4 is a flow diagram that schematically illustrates a method for generating kernel error and log messages, in accordance with an embodiment of the present invention. The steps described in the flow diagram shown in FIG. 4 can be broken down into initialization steps 110-118 and runtime steps 120-132. While for purposes of descriptive simplicity, embodiments herein describe processor 62 performing the initialization steps, another computer (not shown) may perform the initialization steps and convey the initialized configuration file to module 36 prior to processor 62 performing the runtime steps.

In a preprocessing step 110, processor 62 executes preprocessor 82, which comprises a software application configured to load one or more initial source code files 80, and replace each instance of a first function with a respective reference to kernel print function 70 (also referred to herein as a second function), thereby producing one or more respective corresponding preprocessed source code files 84. For example, if the first function comprises PRINTK and the second function comprises GLOBAL_LOG, then processor 62 can create the corresponding preprocessed source code file 82 processor 62 by replacing each instance of:

```
printk (KERN_INFO "%s- version %s\n", ,
       my_driver_string, ,my_driver_version);
``` in the given initial source code file with:

```
Global_log (printk(KERN_INFO "%s - version %s\n,
            my_driver_string, my_driver_version));
```

The following first table lists a sample initial source code file 60 (my_kernel_program1.c) that can be loaded to preprocessor application 82:

```
my_kernel_program1.c
int my_debug_flag=0; ...
#define LOCAL_DEBUG_OUT (args...)
    if (my_debug_flag!=0)
    printk(KERN_DEBUG "myname: " args)
    int the_init_module ( ) void
    {
    /* log using the standard kernel mechanism,
    as well as my own local; mechanism */
    printk(KERN_INFO "%s- version %s\n", ,
        my_driver_string, ,my_driver_version);
        /* use std kernel message mechanism */
    LOCAL_DEBUG_OUT ("%s - version %s\n,
        my_driver_string,
        my_driver_version);
    /* a local debug only msg */
    ...
    }
```

The following second table lists a sample preprocessed source code file 84 (my_kernel_program2.c) that preprocessor application 82 can produce from the sample initial source code file listed in the first table:

```
my_kernel_program2.c
int my_debug_flag=0;
#define LOCAL_DEBUG_OUT (args...)
    Global_log (my_debug_flag!=0,
    printk(KERN_DEBUG"myname "args))
    ...
    int the_init_module
    {
    /* log using the standard kernel mechanism,
    as well as my own local; mechanism */
    Global_log (printk(KERN_INFO "%s - version %s\n,
        my_driver_string,
        my_driver_version));
    /* use the local program msg*/
    LOCAL_DEBUG_OUT ("%s - version %s\n,
        my_driver_string,
        my_driver_version);
    /* a local debug only msg */
    ...
    }
```

In a compilation step 112, processor 62 compiles the one or more respective corresponding preprocessed source code files to generate an executable file on storage device 50. In embodiments described herein, the executable file comprises kernel 68.

In an initialization step 114, processor 62 initializes configuration file 60. To initialize a given record in configuration file 60, processor 62 can first identify, in a given respective corresponding preprocessed source code file 84, a given reference to the second function call having a respective message text 94, the given respective corresponding preprocessed source code file having a given file name. Processor 62 can then calculate, using the given file name and the respective message text, a configuration checksum, and assign a respective destination to the configuration checksum. As described supra, the respective destination may comprise console 66, kernel message buffer 72, kernel log file 76, event monitoring application 74 or a null destination. Upon assigning the respective destination to the configuration checksum, processor 62 can add a record to configuration file 60, store the respective destination and a key comprising the configuration checksum to the added record.

In a load step 116, processor 62 loads the record added to configuration file (in step 114) 60 to an entry in configuration table 78. If there are multiple records in configuration file 60, then processor 62 loads the records to configuration table 78, so that each record in the configuration file 60 has a corresponding entry in the configuration table.

While embodiments herein describe processor 62 populating configuration table 78 with data stored in configuration file 60, other methods of populating the configuration table are considered to be within the spirit and scope of the present invention. In additional embodiments, processor 62 can receive checksums and respective destinations from an input received via a keyboard (not shown) coupled to module 36. For example, a systems administrator (not shown) can input a command line parameter for kernel 68, the command line parameter comprising a checksum and a respective destination that processor 62 can store to an entry to configuration table 78. Alternatively, processor 62 can present an input screen on console 66, the systems administrator can enter a checksum and a respective destination into the input screen, and the processor can store the entered checksum and respective destination to an entry to configuration table 78.

In an execution step 118, processor 62 starts executing kernel 68, and in a first comparison step 120, the processor waits to receive a request to convey a system message (e.g., to an operating system kernel log message via a call to kernel print function 70) from kernel 68. The request comprises parameters such as message text 94 (also referred to herein as a text string) and a priority parameter. Similar to the PRINTK function included in Linux™ kernels, kernel print function 70 may be configured with a default destination for each of the priority parameters. The priority parameter typically comprises an integer value between zero and seven, where zero indicates the most critical priority level and seven indicates the least critical priority level. In some embodiments, the priority levels may be defined as follows:

0. The message indicates that the system is unusable. Also referred to as KERN_EMERG.
1. The message indicates that action must be taken immediately. Also referred to as KERN_ALERT.
2. The message indicates that a critical condition exists. Also referred to as KERN_CRIT.
3. The message indicates that an error condition. Also referred to as KERN_ERR.
4. The message indicates that a warning condition exists. Also referred to as KERN_WARNING.
5. The message indicates that a normal but significant condition exists. Also referred to as KERN_NOTICE.
6. The message is solely informational. Also referred to as KERN_INFO.
7. The message comprises a debug-level message. Also referred to as KERN_DEBUG.

Upon receiving the request, in an identification step 122, processor 62 identifies a name of one of the respective corresponding preprocessed source code file 84 that contains the kernel print function call that conveyed the request. While embodiments herein describe a method for processor 62 receiving a request to generate an operating system kernel message, receiving a request to generate other types of system messages is considered to be within the spirit and scope of the present invention. For example, processor 62 may execute a database server application, and the database server application may convey requests to generate a message indicating a status of the database server.

In a calculation step 124, processor 62 calculates, using the identified name and the received message text, a message checksum. In some embodiments processor 62 can identify a path for a directory on storage device 50 that stores the given identified source code file, and the processor can calculate the message checksum based on the path, the name and the received message text. As described hereinbelow, processor 62 can use the calculated message checksum to determine a destination for the received message text.

In a second comparison step 126, processor 62 searches configuration table 78 to identify an entry in the configuration table having a key equal to the calculated message checksum. If processor 62 identifies an entry with a key matching the calculated message checksum, then in a retrieval step 128, processor 62 retrieves the respective destination from the identified entry, conveys the message text to the retrieved destination in a first convey step 130, and the method continues with step 120.

Returning to step 126, if processor 62 fails to identify an entry in configuration table 78 with a key matching the checksum calculated in step 118, then in a second convey step 132, the processor conveys the received message text to the respective default destination for the priority level indicated by the received priority parameter, and the method returns to step 120.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method, comprising:
    replacing, in one or more initial source code files, each reference to a first function configured to convey operating system kernel log messages with a respective reference to a second function configured to convey the operating system kernel log messages, thereby producing respective corresponding preprocessed source code files for the one or more initial source code files;
    compiling the respective corresponding preprocessed source code files, thereby creating an operating system kernel;
    prior to executing the operating system kernel:
        identifying, in a given respective corresponding preprocessed source code file, a given reference to the second function call having a respective message text, the given respective corresponding preprocessed source code file having a given file name,
        calculating, using the given file name and the respective message text, a configuration checksum,
        assigning a respective destination to the configuration checksum,
        adding a record to a configuration file stored on a storage device coupled to the processor,
        storing, to the added record, the respective destination and a key comprising the configuration checksum, and
        loading the record to an entry in a configuration table stored in a memory coupled to the processor; and
    while executing the operating system kernel:
        determining, based on an identified name and a text string, a computed destination for the text string, including calculating, using the identified name and the text string, a message checksum, and identifying, in the configuration table, an entry having a key equal to the message checksum, and wherein the determined destination comprises the respective destination in the identified entry, and
        identifying a path for a directory storing the one of the respective corresponding preprocessed source code files, and determining the computed destination based on the path, the name and the text string.

2. The method according to claim 1, and comprising, while executing the operating system kernel: receiving, by the processor, a call to the second function, the call comprising the text string;
    identifying the name of one of the respective corresponding preprocessed source code files storing the call to the second function; and
    conveying the text string to the computed destination.

3. The method according to claim 1, wherein the request comprises the text string and a priority parameter, and wherein the priority parameter comprises a numeric value indicating a priority level selected from a list comprising a KERN_EMERG priority level, a KERN_ALERT priority level, a KERN_CRIT priority level, a KERN_ERR priority level, a KERN_WARNING priority level, a KERN_NOTICE priority level, a KERN_INFO priority level, and a KERN_DEBUG priority level, and wherein each of the priority levels has a respective default destination.

4. The method according to claim 3, wherein each of the default and the computed destinations is selected from a list comprising a console, a kernel message buffer in the memory, a kernel log file on the storage device, an error event application executing on the processor and a null destination.

5. The method according to claim 4, and comprising upon failing to identify an entry in the configuration table having a key equal to the calculated checksum, conveying the received text string to the respective default destination for the priority level indicated by the received priority parameter.

6. An apparatus, comprising:
    a storage device configured to store one or more initial source code files;
    a processor coupled to the storage device and configured:
    to replace, in the one or more initial source code files, each reference to a first function configured to convey operating system kernel log messages with a respective reference to a second function configured to convey the operating system kernel log messages, thereby producing respective corresponding preprocessed source code files for the one or more initial source code files, to compile the respective corresponding preprocessed source code files, thereby creating an operating system kernel, and;

a memory coupled to the processor and configured to store a configuration table, and wherein the storage device is configured to store a configuration file, and wherein prior to executing the operating system kernel, the processor is configured:

to identify, in a given respective corresponding preprocessed source code file, a given reference to the second function call having a respective message text, the given respective corresponding preprocessed source code file having a given file name, to calculate, using the given file name and the respective message text, a configuration checksum, to assign a respective destination to the configuration checksum, to add a record to the configuration file, to store, to the added record, the respective destination and a key comprising the configuration checksum, and to load the record to an entry in the configuration table, and while executing the operating system kernel:

to determine, based on an identified name and a text string, a computed destination for the text string, including to calculate, using the identified name and the text string, a message checksum, and to identify, in the configuration table, an entry having a key equal to the message checksum, and wherein the determined destination comprises the respective destination in the identified entry, and to identify a path for a directory storing the one of the respective corresponding preprocessed source code files, and to determine the computed destination based on the path, the name and the text string.

7. The apparatus according to claim 6, wherein the processor is configured to, while executing the operating system kernel: receive a call to the second function, the call comprising the text string;

identify the name of one of the respective corresponding preprocessed source code files storing the call to the second function; and convey the text string to the computed destination.

8. The apparatus according to claim 6, wherein the request comprises the text string and a priority parameter, and wherein the priority parameter comprises a numeric value indicating a priority level selected from a list comprising a KERN_EMERG priority level, a KERN_ALERT priority level, a KERN_CRIT priority level, a KERN_ERR priority level, a KERN_WARNING priority level, a KERN_NOTICE priority level, a KERN_INFO priority level, and a KERN_DEBUG priority level, and wherein each of the priority levels has a respective default destination.

9. The apparatus according to claim 8, wherein each of the default and the computed destinations is selected from a list comprising a console, a kernel message buffer in the memory, a kernel log file on the storage device, an event monitoring application executing on the processor and a null destination.

10. The apparatus according to claim 9, wherein upon failing to identify an entry in the configuration table having a key equal to the calculated checksum, the processor is configured to convey the received text string to the respective default destination for the priority level indicated by the received priority parameter.

11. A computer program product, the computer program product comprising:

a non-transitory computer readable storage medium having computer readable program code embodied therewith, the computer readable program code comprising:

computer readable program code configured to replace, in one or more initial source code files, each reference to a first function configured to convey operating system kernel log messages with a respective reference to a second function configured to convey the operating system kernel log messages, thereby producing respective corresponding preprocessed source code files for the one or more initial source code files;

computer readable program code configured to compile the respective corresponding preprocessed source code files, thereby creating an operating system kernel;

prior to executing the operating system kernel:

computer readable program code configured to identify, in a given respective corresponding preprocessed source code file, a given reference to the second function call having a respective message text, the given respective corresponding preprocessed source code file having a given file name, computer readable program code configured to calculate, using the given file name and the respective message text, a configuration checksum, computer readable program code configured to assign a respective destination to the configuration checksum, computer readable program code configured to add a record to a configuration file stored on a storage device, computer readable program code configured to store, to the added record, the respective destination and a key comprising the configuration checksum, and computer readable program code configured to load the record to an entry in a configuration table stored in a memory, and while executing the operating system kernel:

computer readable program code configured to determine, based on an identified name and a text string, a computed destination for the text string by calculating, using the identified name and the text string, a message checksum, and identifying, in the configuration table, an entry having a key equal to the message checksum, and wherein the determined destination comprises the respective destination in the identified entry, and computer readable program code configured to identify a path for a directory storing the one of the respective corresponding preprocessed source code files, and to determine the computed destination based on the path, the name and the text string.

12. The computer program product of claim 11, and comprising, while executing the operating system kernel: computer readable program code configured to receive, by a processor, a call to the second function, the call comprising the text string;

computer readable program code configured to identify the name of one of the respective corresponding preprocessed source code files storing the call to the second function; and computer readable program code configured to convey the text string to the computed destination.

\* \* \* \* \*